(12) United States Patent
Landry et al.

(10) Patent No.: US 7,804,859 B2
(45) Date of Patent: Sep. 28, 2010

(54) SYSTEM AND METHOD OF PROVIDING ELECTRICAL ISOLATION

(75) Inventors: D. Matthew Landry, Austin, TX (US); Phillip A. Callahan, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 107 days.

(21) Appl. No.: 12/164,624

(22) Filed: Jun. 30, 2008

(65) Prior Publication Data

US 2009/0323717 A1    Dec. 31, 2009

(51) Int. Cl.
  *H04J 3/04* (2006.01)
(52) U.S. Cl. .................. 370/535; 370/464; 370/498
(58) Field of Classification Search .................. 370/352, 370/535, 464, 498
  See application file for complete search history.

(56) References Cited

U.S. PATENT DOCUMENTS

| | | | |
|---|---|---|---|
| 4,434,474 A | 2/1984 | Best et al. ................. 364/900 |
| 4,495,603 A | 1/1985 | Varshney ................. 365/233 |
| 4,534,039 A | 8/1985 | Dodds et al. ............... 375/36 |
| 4,629,480 A | 12/1986 | Margraf .................... 55/282 |
| 4,677,646 A | 6/1987 | Dodds et al. ............... 375/36 |
| 5,121,284 A | 6/1992 | Onodera et al. ............ 361/152 |
| 5,369,687 A | 11/1994 | Farkas ........................ 379/98 |
| 5,875,235 A | 2/1999 | Mohajeri ................ 379/93.36 |
| 6,107,948 A | 8/2000 | Scott et al. ................. 341/143 |
| 6,191,717 B1 | 2/2001 | Scott et al. ................. 341/143 |
| 6,304,597 B1 | 10/2001 | Dupuis et al. ............... 375/222 |
| 6,351,530 B1 | 2/2002 | Rahamim et al. ...... 379/399.01 |
| 6,359,973 B1 | 3/2002 | Rahamim et al. ........ 379/93.05 |
| 6,359,983 B1 | 3/2002 | Krone et al. ........... 379/399.01 |
| 6,389,061 B1 | 5/2002 | Scott et al. ................... 375/220 |
| 6,430,883 B1 | 8/2002 | Paz et al. .................... 375/285 |
| 6,611,553 B1 | 8/2003 | Scott et al. ................... 375/220 |
| 6,647,101 B2 | 11/2003 | Rahamim et al. ........ 379/93.05 |
| 6,724,891 B1 | 4/2004 | Huang et al. ........... 379/399.01 |
| 6,735,246 B1 | 5/2004 | Dupuis et al. ............... 375/222 |
| 6,751,315 B1 | 6/2004 | Liu et al. ................ 379/413.02 |
| 6,819,169 B1 | 11/2004 | Kunc et al. .................. 327/560 |
| 6,826,225 B1 | 11/2004 | Dupuis et al. ............... 375/222 |
| 6,870,046 B2 | 3/2005 | Bennett et al. ............. 536/24.5 |
| 7,016,490 B2 | 3/2006 | Beutler et al. ............... 379/412 |
| 7,020,187 B1 | 3/2006 | Reid et al. ................... 375/220 |
| 7,031,458 B2 | 4/2006 | Holcombe et al. ...... 379/399.02 |
| 7,088,803 B2 | 8/2006 | Rahamim et al. ........ 379/93.05 |
| 7,154,940 B2 | 12/2006 | Scott et al. ................... 375/220 |
| 7,200,167 B2 | 4/2007 | Scott et al. ................... 375/220 |

(Continued)

*Primary Examiner*—Chi H Pham
*Assistant Examiner*—Robert Lopata
(74) *Attorney, Agent, or Firm*—Polansky & Associates, P.L.L.C.; R. Michael Reed (57) ABSTRACT

In a particular embodiment, a system includes an input/output (I/O) interface adapted to couple to a network cable to receive power and data and includes a physical transport layer (PHY) circuit including multiple channels coupled to the I/O interface. The PHY circuit is adapted to send data to and receive data from a network device via the multiple channels. The system further includes a multiplexer circuit coupled to the PHY circuit to multiplex data from the multiple channels into a multiplexed data stream and includes an isolation barrier circuit coupled to the multiplexer circuit and to a particular circuit. The isolation barrier is adapted to electrically isolate a particular circuit from the multiplexer circuit, the PHY circuit, and the I/O interface.

23 Claims, 5 Drawing Sheets

U.S. PATENT DOCUMENTS

| | | | |
|---|---|---|---|
| 7,203,224 B2 | 4/2007 | Scott et al. | 375/220 |
| 7,269,210 B2 | 9/2007 | Liu | 375/222 |
| 7,272,669 B2 * | 9/2007 | Mattur et al. | 710/16 |
| 7,283,584 B2 | 10/2007 | Scott et al. | 375/220 |
| 7,292,600 B2 * | 11/2007 | Binder | 370/463 |
| 7,301,995 B2 | 11/2007 | Scott et al. | 375/220 |
| 7,356,588 B2 | 4/2008 | Stineman, Jr. et al. | 709/224 |
| 7,536,566 B2 * | 5/2009 | Hemmah et al. | 713/300 |
| 2002/0126806 A1 | 9/2002 | Rahamim et al. | 379/93.05 |
| 2002/0136395 A1 | 9/2002 | Saksa et al. | 379/412 |
| 2002/0172351 A1 | 11/2002 | Beutler et al. | 379/399.01 |
| 2002/0181675 A1 | 12/2002 | Venkataraman et al. | 379/93.01 |
| 2003/0091183 A1 | 5/2003 | Holcombe et al. | 379/399.01 |
| 2003/0179818 A1 | 9/2003 | D'Angelo et al. | 375/222 |
| 2003/0206626 A1 | 11/2003 | Scott et al. | 379/413 |
| 2005/0036604 A1 | 2/2005 | Scott et al. | 379/413 |
| 2005/0097369 A1 * | 5/2005 | Bowser et al. | 713/300 |
| 2006/0008075 A1 | 1/2006 | Scott et al. | 379/399.01 |
| 2006/0075173 A1 | 4/2006 | Mattur et al. | 710/301 |
| 2006/0117089 A1 * | 6/2006 | Karam | 709/208 |
| 2006/0133598 A1 | 6/2006 | Pagnanelli | 379/406.08 |
| 2006/0133599 A1 | 6/2006 | Pagnanelli | 379/406.08 |
| 2006/0268898 A1 | 11/2006 | Karam | 370/401 |
| 2007/0003052 A1 | 1/2007 | Hein et al. | 379/399.01 |
| 2007/0003055 A1 | 1/2007 | Bark et al. | 379/413 |
| 2007/0011547 A1 | 1/2007 | Karam | 714/746 |
| 2007/0019445 A1 | 1/2007 | Blaha et al. | 363/21.12 |
| 2007/0121832 A1 | 5/2007 | Ghoshal | 379/93.36 |
| 2007/0147354 A1 * | 6/2007 | He | 370/352 |
| 2007/0259644 A1 * | 11/2007 | Chan et al. | 455/402 |
| 2007/0263852 A1 | 11/2007 | Schley-May et al. | 379/413 |
| 2008/0080105 A1 * | 4/2008 | Blaha et al. | 361/38 |
| 2008/0181316 A1 * | 7/2008 | Crawley et al. | 375/258 |
| 2008/0238447 A1 * | 10/2008 | de la Torre Vega et al. | 324/676 |
| 2008/0238656 A1 * | 10/2008 | de la Torre Vega et al. | 340/538.16 |
| 2008/0267212 A1 * | 10/2008 | Crawley et al. | 370/463 |
| 2009/0158377 A1 * | 6/2009 | Diab et al. | 725/117 |

\* cited by examiner

SYSTEM AND METHOD OF PROVIDING ELECTRICAL ISOLATION

FIELD OF THE INVENTION

The present disclosure is generally related to a system and method of providing electrical isolation. More particularly, the present disclosure relates to a powered device adapted to receive power and data from a single cable, where the powered device includes electrical isolation.

BACKGROUND OF THE INVENTION

In general, Power over Ethernet (PoE), which is outlined in IEEE Std 802.3™-2005 clause 33 (the PoE standard), refers to a technique for delivering power and data to an electronic device via Ethernet cabling. In a PoE system, a power sourcing equipment (PSE) device provides a power supply to electronic devices, which may be referred to as powered devices, via an input/output (I/O) network interface that couples to an Ethernet cable. An example of such an I/O network interface is an RJ-45 connector. PoE eliminates the need for a separate power source to deliver power to attached powered devices (PDs). Such powered devices may include Voice over Internet Protocol (VoIP) telephones, wireless routers, security devices, field devices to monitor process control parameters, data processors, other electronic devices, or any combination thereof.

In general, the PoE standard requires the electrical circuitry of the powered device to be electrically isolated from the I/O network interface and from other interfaces that are user accessible, including a metal housing, a display, a touch screen, a switch, a screw, another connector, or any combination thereof. Conventionally, the I/O network interface is isolated from physical transport layer (PHY) circuitry by a transformer that provides such electrical isolation. However, such transformers consume power, can attenuate signals sent via the PHY circuitry, and can occupy valuable printed circuit board (PCB) space. Hence, there is a need for improved and/or simplified (smaller) electrical isolation circuitry.

SUMMARY OF THE INVENTION

In a particular embodiment, a system includes an input/output (I/O) interface adapted to couple to a network cable to receive power and data and includes a physical transport layer (PHY) circuit including multiple channels coupled to the I/O interface. The PHY circuit is adapted to send data to and receive data from a network device via the multiple channels. The system further includes a multiplexer circuit coupled to the PHY circuit to multiplex data from the multiple channels into a multiplexed data stream and includes an isolation barrier circuit coupled to the multiplexer circuit and to a particular circuit. The isolation barrier is adapted to electrically isolate a particular circuit from the multiplexer circuit, the PHY circuit, and the I/O interface.

In another particular embodiment, a circuit device includes a physical transport layer (PHY) circuit including multiple channels coupled to an I/O interface. The PHY circuit is adapted to send data to and receive data from a network device via the multiple channels. The circuit device further includes a multiplexer circuit coupled to the PHY circuit to multiplex data from the multiple channels onto a bidirectional input/output (I/O) interface (e.g., a media independent interface (MII), a Gigabit MII (GMII), a Reduced GMII (RGMII), or other high speed interface) bus and a digital isolation barrier circuit coupled to the bidirectional I/O interface bus and adapted to electrically isolate processing logic from the multiplexer circuit, the PHY circuit, and the I/O interface.

A method of providing electrical isolation is disclosed that includes receiving data via multiple channels from an input/output (I/O) interface at a physical transport layer (PHY) circuit of a powered device and multiplexing the data from the multiple channels into a data stream for transmission via an input/output (I/O) interface (e.g., MII, GMII, RGMII, or other high speed data bus) bus. The method further includes electrically isolating the PHY circuit from media access control (MAC) circuitry coupled to the I/O interface bus via a digital isolation barrier.

DETAILED DESCRIPTION OF ILLUSTRATIVE EMBODIMENTS

Figure 1:
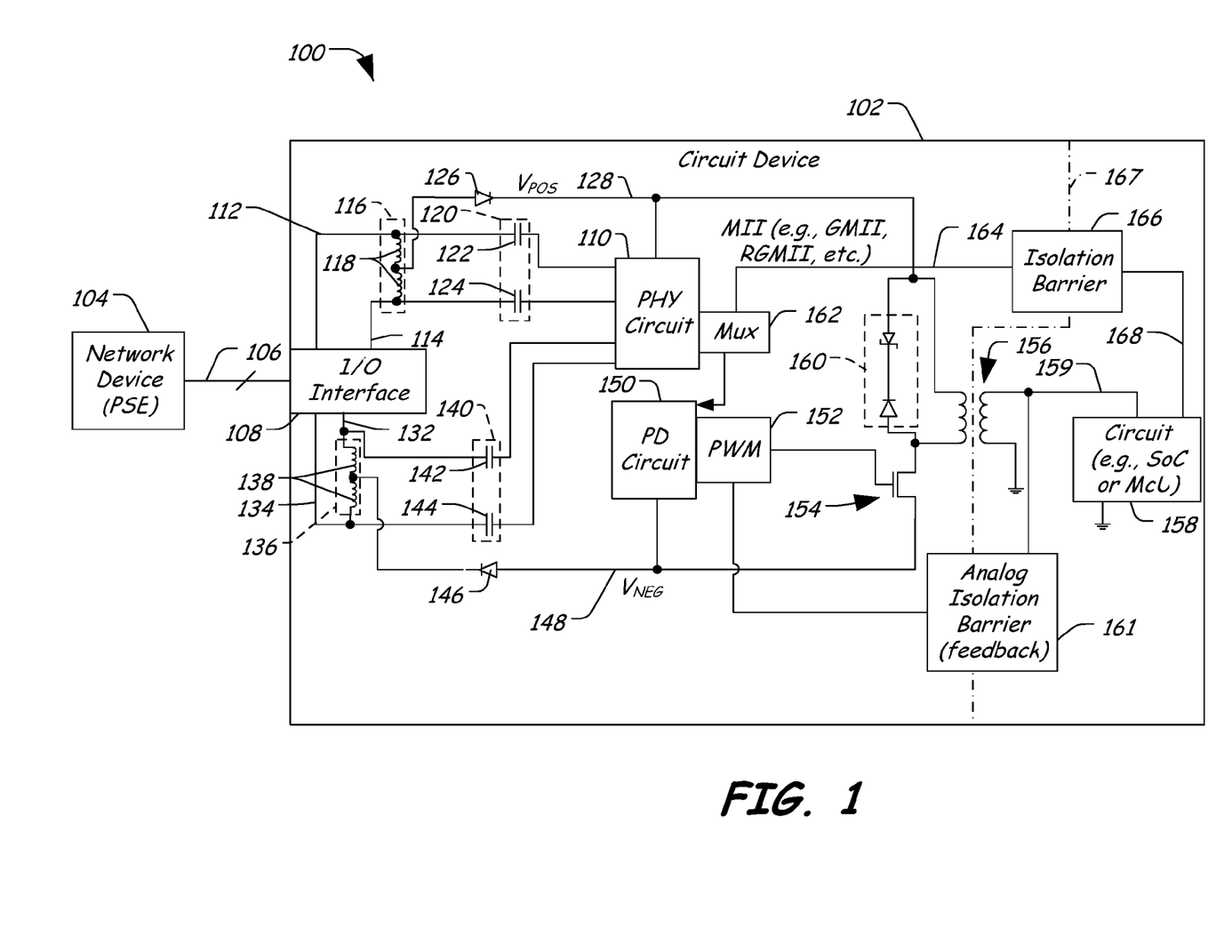
FIG. 1 is a block diagram of a particular illustrative embodiment of a system including a powered device having a circuit to provide electrical isolation.

FIG. 1 is a block diagram of a particular illustrative embodiment of a system 100 including a circuit device, such as a powered device 102, having a circuit to provide electrical isolation. The powered device 102 is adapted to receive data and power from a network device 104 via a cable 106. In a particular example, the network device 104 is a power sourcing equipment (PSE) device adapted to supply power and data to the powered device 102 according to one of the IEEE Std 802.3™-2005 clause 33 (the Power over Ethernet (PoE) standard), a more recent PoE standard, another power over broadband protocol, a proprietary protocol, or any combination thereof. The cable 106 can be an Ethernet cable or another type of cable that includes multiple wire pairs capable of carrying data, power, or any combination thereof.

The powered device 102 includes an input/output (I/O) interface 108 that is coupled to a physical transport layer (PHY) circuit 110 via multiple channels, including first, second, third, and fourth channels 112, 114, 132 and 134. The powered device 102 includes an alternating current (AC) block circuit 116 coupled between the first and second channels 112 and 114. The AC block circuit 116 includes inductors 118 arranged in series between the first and second channels 112 and 114 to block power supply noise and to prevent data signal attenuation from a shunt connection to an electrical ground via the power supply. Further, the powered device 102 includes a direct current (DC) block circuit 120, including a capacitor 122, coupled to the first channel 112 to block a DC signal from reaching the PHY circuit 110. Additionally, the second DC block circuit includes a capacitor 124 that is coupled to the second channel 114 to block a DC signal from reaching the PHY circuit 110. The powered device 102 also includes a diode 126 having an anode terminal coupled between the inductors 118 of the AC block circuit 116 and having a cathode terminal coupled to a positive voltage supply terminal 128 and to the PHY circuit 110.

The powered device 102 includes an alternating current (AC) block circuit 136 coupled between the third and fourth channels 132 and 134. The AC block circuit 136 includes inductors 138 arranged in series between the third and fourth channels 132 and 134 to block power supply noise and to prevent data signal attenuation from a shunt connection to an electrical ground via the power supply. Further, the powered device 102 includes a second direct current (DC) block circuit 140, including a capacitor 142, coupled to the third channel 132 to block a DC signal from reaching the PHY circuit 110. Additionally, the DC block circuit 140 includes a second capacitor 144 that is coupled to the fourth channel 134 to block a DC signal from reaching the PHY circuit 110. The powered device 102 also includes a diode 146 having an anode terminal coupled to a negative power supply 148 and coupled to a powered device (PD) control circuit 150 and having a cathode terminal coupled between the inductors 138 of the AC block circuit 136.

It should be understood that the diodes 126 and 146 are adapted to provide a rectified positive and negative power supply rail at the positive and negative terminals 128 and 148, respectively. In a particular embodiment, the diodes 126 and 146 may be part of a polarity-independent diode-bridge that allows inputs of any polarity on channels 112, 114, 132, and 134 to be rectified to provide a positive power supply at the positive supply terminal 128 and a negative power supply at the negative supply terminal 148. In a particular example, the I/O interface 108 may be an RJ-45 connector that is coupled to an Ethernet cable, which includes multiple wire pairs. In a particular example, the network device 104 may provide a power supply to the circuit device 102 via any of the wire pairs. In this particular example, the circuit device 102 may include multiple diode bridges to rectify the received power supply and to provide the rectified power supply to the positive and negative supply terminals 128 and 148. The diodes 126 and 146 may represent the active diodes of one of the diode bridges.

The powered device 102 further includes a pulse-width modulator (PWM) circuit 152 adapted to control a switch, such as a field effect transistor (FET) 154, to selectively provide power to a circuit 158, which may include various circuit components, including processors, processing logic, other circuits, or any combination thereof. The FET 154 includes a first terminal coupled to the negative power supply terminal 148, a control terminal coupled to the PWM circuit 152, and a second terminal coupled to a flyback circuit 160 and to a first winding of a transformer 156. The flyback circuit 160 and the first winding of the transformer 156 are coupled in parallel between the second terminal of the FET 154 and the positive supply terminal 128. The transformer 156 includes a second terminal coupled to the circuit 158 via a line 159 to provide an isolated, regulated power supply to the circuit 158. Further, the flyback circuit 160 includes a diode that blocks current flow to the circuit 158 from the positive power supply terminal 128 when the switch FET 154 is on, and that allows current to flow into power supply terminal 128 through a breakdown diode when the switch 154 is off and when the voltage at the second terminal of the FET 154 exceeds the breakdown voltage. The circuit device 102 further includes an analog isolation barrier (or feedback circuit) 161 that is coupled to the line 159 and to the PWM circuit 152 to provide feedback across the isolation barrier. In a particular embodiment, the analog isolation barrier 161 can be another transformer circuit, an optical-isolator circuit, or other analog isolation circuitry to maintain isolation between the isolated circuit 158 and the PWM circuit 152.

The circuit device 102 also includes a multiplexer 162 coupled to the PHY circuit 110 and adapted to multiplex data from the first, second, third, and fourth channels 112, 114, 132, and 134 to a data stream for transmission to the circuit 158 via a first input/output (I/O) interface bus 164. In a particular embodiment, the I/O interface bus 164 can be a serial data bus and the multiplexer 162 is adapted to multiplex the data to a serial data stream for an analog implementation. In another particular embodiment, the I/O interface bus 164 can be a high speed parallel data bus, such as a media independent interface (MII) bus, a Gigabit MII (GMII) bus, a Reduced GMII (RGMII) bus, or another high speed parallel data bus. The circuit device 102 further includes an isolation barrier circuit 166 coupled to the first I/O interface bus 164 and to a second I/O interface bus 168, which is coupled to the circuit 158. The second I/O interface bus 168 can be a serial data bus or a high speed parallel data bus.

In a particular embodiment, the isolation barrier circuit 166 can be a digital or analog isolation barrier circuit adapted to electrically isolate the circuit 158 from the PHY circuit 110. Thus, the isolation barrier circuit 166, the transformer 156, and the analog isolation barrier 161 cooperate to form an electrical isolation barrier 167 between the circuit 158 and other circuitry that is coupled to the I/O interface 108. In a particular embodiment, the isolation barrier circuit 166 can be a capacitor, a radio frequency isolation circuit, an optical isolation circuit, a pulse transformer, another digital isolation circuit, or any combination thereof. In another particular embodiment, the isolation barrier circuit 166 can include high-speed chip-scale isolators, including chip-scale transformer isolators, high-speed capacitor-based isolators, or any combination thereof. In a particular example, the digital isolation barrier is adapted to support signals having carrier frequencies of two or more (2+) Gigahertz (GHz) using amplitude modulation. As used herein, the term "chip-scale" refers to a circuit device that can be formed using any integrated fabrication method.

In a particular embodiment, by positioning the isolation barrier circuit 166 between the PHY circuit 110 and the circuit 158 instead of between the I/O interface 108 and the PHY circuit 110, the PHY circuit 110 can be powered before the circuit 158 receives power. In a particular example, the PHY circuit 110 and the PD control circuit 150 receive power from the I/O interface 108 before the circuit 158 receives power. In a particular embodiment, the PHY circuit 110 is adapted to perform communications link negotiation between the network device 104 and the powered device 102. Generally, the PHY circuit 110 can perform communications link negotiation more rapidly than higher layer address management circuits, such as the circuit 158. Accordingly, by allowing the PHY circuit 110 to perform such negotiations, the PHY circuit 110 can be powered and can respond to received data quickly. In this particular example, loopback modes, vendor-specific identification processes, intelligent power control, and other functions can be accomplished by the PHY circuit 110 and the PD control circuit 150 independent of the circuit 158. The term "loopback" refers to a diagnostic test function that returns a transmitted signal back to a sending device to monitor data integrity across a communications link. The PHY circuit 110 can be adapted to perform loopback operations without activating the circuit 158.

A particular advantage provided by placing the isolation barrier 166 between the PHY circuit 110 and the circuit 158 rather than between the I/O interface 108 and the PHY 110 is that a single isolation barrier 166 can be used to provide isolation for each of the channels 112, 114, 132, and 134. The single isolation barrier 166 reduces the circuit size, since transformer windings need not be used for each channel. Further, by sharing the isolation barrier 166 among the multiple channels 112, 114, 132, and 134, the overall cost of the circuit is reduced. Additionally, power consumed by the isolation barrier 166 is reduced since the isolation barrier 166 no longer attenuates signals between the PHY circuit 110 and the I/O interface 108. Another advantage is that the PHY circuit 110 can be used to implement link negotiation and other functions, while the circuit 158 is powered down, thereby reducing overall power consumption.

Figure 2:
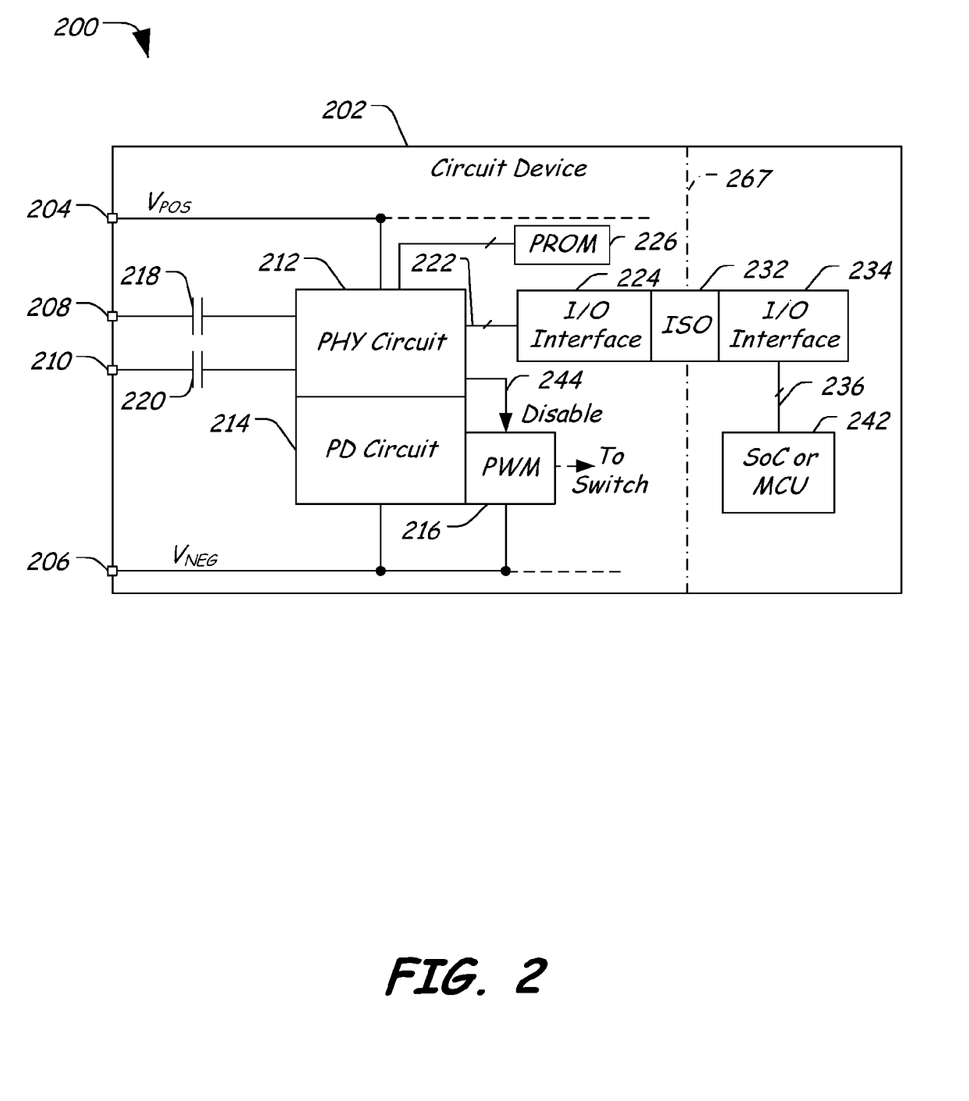
FIG. 2 is a block diagram of a particular illustrative embodiment of a powered device including a circuit to provide electrical isolation.

FIG. 2 is a block diagram of a particular illustrative embodiment of a powered device 200 including a circuit to provide electrical isolation. The powered device 200 includes a circuit device 202 that includes a positive voltage terminal 204 and a negative voltage terminal 206. In a particular embodiment, the voltage potential between the positive voltage terminal 204 and the negative voltage terminal 206 can be approximately 48 volts. Further, the circuit device 202 includes a first data terminal 208 and a second data terminal 210. The first data terminal 208 is coupled to a physical transport layer (PHY) circuit 110 via a first capacitor 218 to block direct current (DC) flow to the PHY circuit 110 from the first data terminal 208. The second data terminal 210 is coupled to the PHY circuit 110 via a second capacitor 220 to block DC flow to the PHY circuit 110 from the second data terminal 210. The circuit device 202 also includes a powered device (PD) circuit 214. The PHY circuit 110 is coupled to the positive voltage terminal 204 and the PD circuit 214 is coupled to the negative voltage terminal 206.

The PHY circuit 212 is adapted to communicate with a circuit 242 via an I/O interface bus 222, such as a media independent interface (MII), a Gigabit MII (GMII), a Reduced GMII (RGMII), or other high speed parallel data buses. The PHY circuit 212 is coupled to the I/O interface bus 222, which is adapted to carry multiple channels in parallel. The I/O interface bus 222 is coupled to a I/O interface circuit 224 that serializes the multiple channels into a single data stream. In a particular embodiment, the I/O interface circuit 224 can be a serializer/deserializer (SerDes) circuit to serialize data from multiple channels into a single data stream for analog implementations. In another particular embodiment, the I/O interface circuit 224 can be a parallel I/O interface circuit to multiplex the data into a data stream for digital implementations. The I/O interface circuit 224 is coupled to a digital isolation barrier 232 that is adapted to provide electrical isolation. The I/O interface circuit 224 provides the data stream to the digital isolation barrier 232, which provides the isolated stream to a second I/O interface circuit 234 that is coupled to a circuit 242 via a second I/O interface bus 236, which may be a media independent interface (MII) bus, a Gigabit MII (GMII) bus, a Reduced GMII (RGMII), or another high speed parallel interface bus. In a particular embodiment, the circuit 242 can be a system on a chip (SoC), a microprocessor (MCU), processing logic, another type of isolated circuitry, or any combination thereof. In a particular example, the first and second I/O interface circuits 224 and 234 can be multiplexer/de-multiplexer circuits, which can multiplex the multiple channels to a serial or parallel data stream.

The PD circuit 214 is coupled to a pulse-width modulator (PWM) circuit 216, which is adapted to control a switch, such as the switching FET 154 illustrated in FIG. 1. In a particular example, the circuit device 202 can includes the flyback circuit 160, the transformer 156, and the analog isolation barrier 161 illustrated in FIG. 1 to control a power supply provided to the circuit 242. In a particular embodiment, the PWM circuit 216 is coupled to the PHY circuit 212 to receive a disable signal 244 to shut down the switch, leaving only the PHY circuit 212 and the PD circuit 214 operational.

In a particular embodiment, the circuit 242 can be powered down during periods of inactivity to reduce overall power consumption. Further, since the PD circuit 214 and the PHY circuit 212 remain operational, the PHY circuit 212 can include logic to determine when the circuit 242 should be activated and to trigger the PWM circuit 216 to activate the switch to provide power to the circuit 242 when switching from an inactive or reduced power mode to an operating (full power) mode.

It should be understood that while the PHY circuit 212, the PD circuit 214 and the PWM circuit 216 are illustrated as separate components, in a particular embodiment, the PHY, PD, and PWM circuits 212, 214, and 224 can be integrated into a single integrated circuit package or a multi-chip module.

Further, in a particular embodiment, the circuit device 202 includes a programmable read-only memory (PROM) 226 that is coupled to the PHY circuit 212. The PROM 226 can be used to store vendor specific identification data, link negotiation protocol information, other information, or any combination thereof. In a particular embodiment, the PHY circuit 212 is adapted to access the PROM 226 to retrieve vendor identification (ID) data and to perform vendor specific authentication (such as communications link negotiation) functions. Further, the PHY circuit 212 can be adapted to perform loopback, vendor specific functions, other functions, or any combination thereof. Such functions can be performed by the PHY circuit 212 even when the circuit 242 is inactive or powered down.

Figure 3:
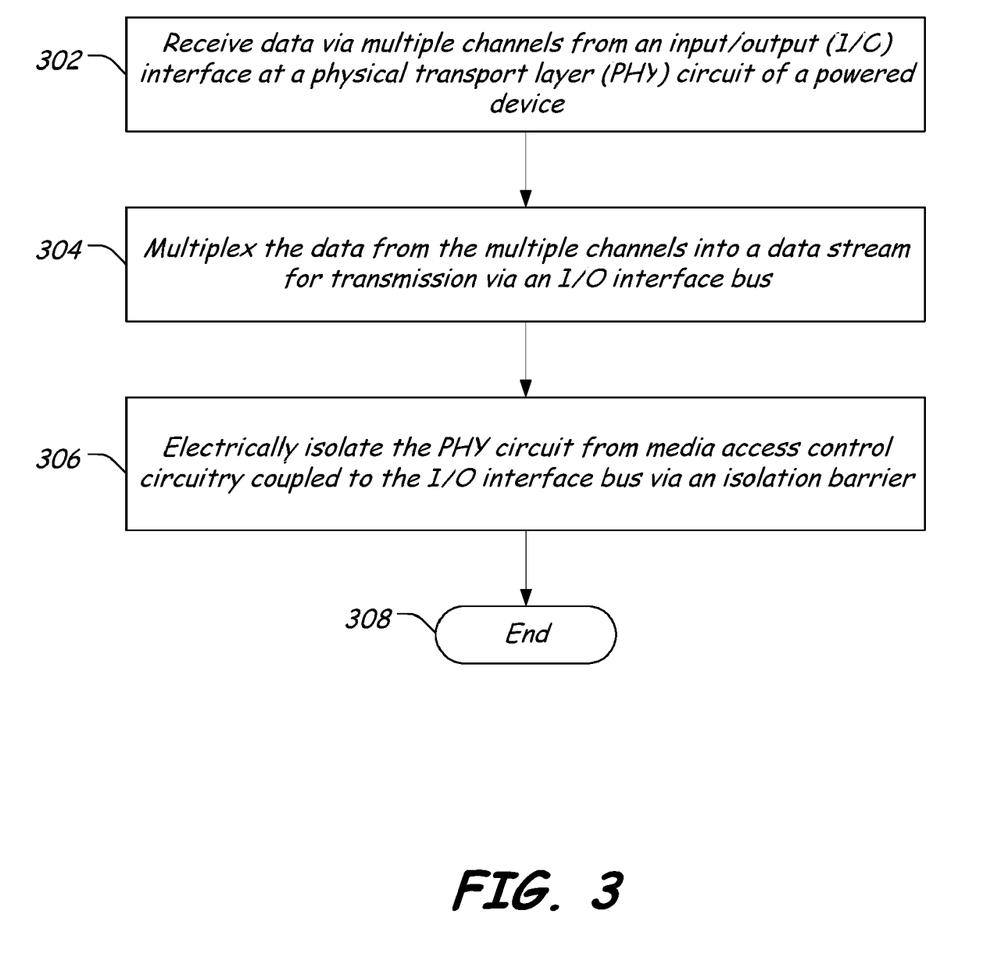
FIG. 3 is a flow diagram of a particular illustrative embodiment of a method of providing electrical isolation.

FIG. 3 is a flow diagram of a particular illustrative embodiment of a method of providing electrical isolation. At 302, data is received via multiple channels from an input/output (I/O) interface at a physical transport layer (PHY) circuit of a powered device. Advancing to 304, the data from the multiple channels is multiplexed into a data stream for transmission via a input/output (I/O) interface bus. In a particular embodiment, the I/O interface bus can be a media independent interface (MII) bus, a Gigabit MII (GMII) bus, a Reduced GMII (RGMII) bus, or another high speed interface bus. Continuing to 306, the PHY circuit is isolated from media access control circuitry coupled to the I/O interface bus via an isolation barrier. In a particular embodiment, the isolation barrier can be an analog isolation barrier, such as a transformer. In another particular embodiment, the isolation barrier can be a digital isolation barrier, such as a capacitor, a radio frequency isolation circuit, an optical isolation circuit, a pulse transformer, another digital isolation circuit, or any combination thereof. In general, the isolation barrier can include chip-scale transformer isolators or capacitor-based (high-speed) isolators. In a particular example, the isolation barrier is adapted to support signals having carrier frequencies of two or more (2+) Gigahertz (GHz) using amplitude modulation. The method terminates at 308.

In a particular embodiment, the method also includes detecting data at the PHY circuit of the powered device and triggering the media access control (MAC) circuitry to switch from a reduced power mode to an operating mode in response to detecting the data. In a particular example, the MAC circuitry is adapted to enter a reduced power mode after a period of inactivity. The reduced power mode can include disabling or deactivating selected circuitry to reduce power consumption by associated circuitry. For example, in a cell phone or other portable device, the reduced power mode can be an idle mode or sleep mode. The MAC circuitry can be triggered to wake up and power up associated circuitry in response to detecting data at the PHY circuit. In another particular embodiment, the method can include negotiating a communications link between the I/O interface of the powered device and a network device coupled to the I/O interface using the PHY circuit.

Further, in a particular embodiment, the circuit device can be a powered device that is adapted to receive power and data from a cable. In a particular example, the circuit device can be a Power over Ethernet (PoE) enabled device that is adapted to operate according to the IEEE Std 802.3™-2005 clause 33 (the PoE standard) or according to more recent PoE standards. In this particular example, the method further includes receiving a powered device (PD) detection signal at the I/O interface during a PD detection operation and generating a PD signature using a PD control circuit in response to receiving the PD detection signal. In a particular embodiment, the PD control circuit and the PHY circuit can be a single integrated circuit package. In another particular example, the circuit device can be adapted to receive power and data via a cable according to power over broadband specifications, other power/data specifications (proprietary or industry standard), or any combination thereof.

Figure 4:
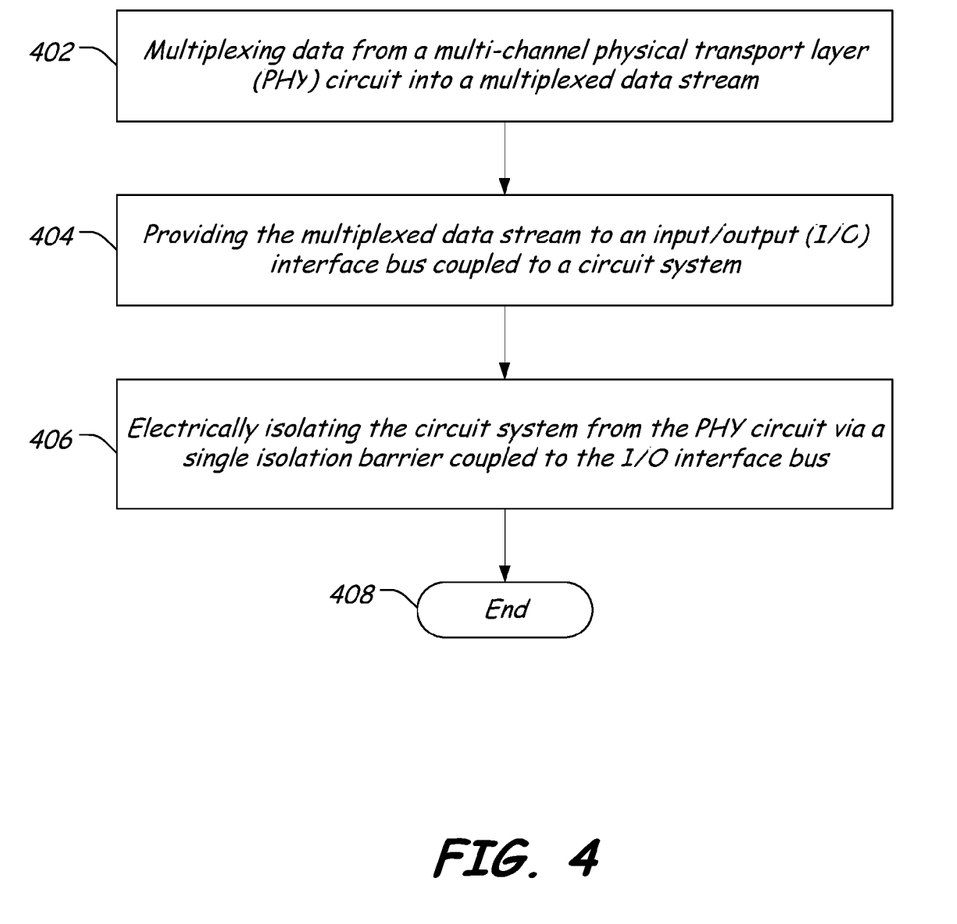
FIG. 4 is a flow diagram of a second particular illustrative embodiment of a method of providing electrical isolation.

FIG. 4 is a flow diagram of a second particular illustrative embodiment of a method of providing electrical isolation. At 402, data from a multi-channel physical transport layer (PHY) circuit are multiplexed into a multiplexed data stream. In a particular embodiment, the PHY circuit is coupled to a network input/output (I/O) interface, such as an RJ-45 connector that is connected to a category-5 (CAT-5) Ethernet cable. In another particular embodiment, the PHY circuit is coupled to a power/data I/O interface to receive power and data. Advancing to 404, the multiplexed data stream is provided to an input/output (I/O) interface bus coupled to a circuit system. In a particular embodiment, the I/O interface bus can be a media independent interface (MII), a Gigabit MII (GMII), a Reduced GMII (RGMII), or another high speed interface. In a particular example, the I/O interface bus is a bi-directional high-speed data bus. Continuing to 406, the circuit system is electrically isolated from the PHY circuit via a single isolation barrier coupled to the I/O interface bus. In a particular example, the single isolation barrier can be a high-speed digital isolation barrier, such as a capacitor, a pulse transformer, an optical isolation circuit, a radio frequency (RF) isolation circuit, another type of digital isolation circuit, or any combination thereof. Further, the single isolation barrier can be shared by the multiple channels of the PHY circuit to transfer data between the circuit system and the PHY circuit. The method terminates at 408.

Figure 5:
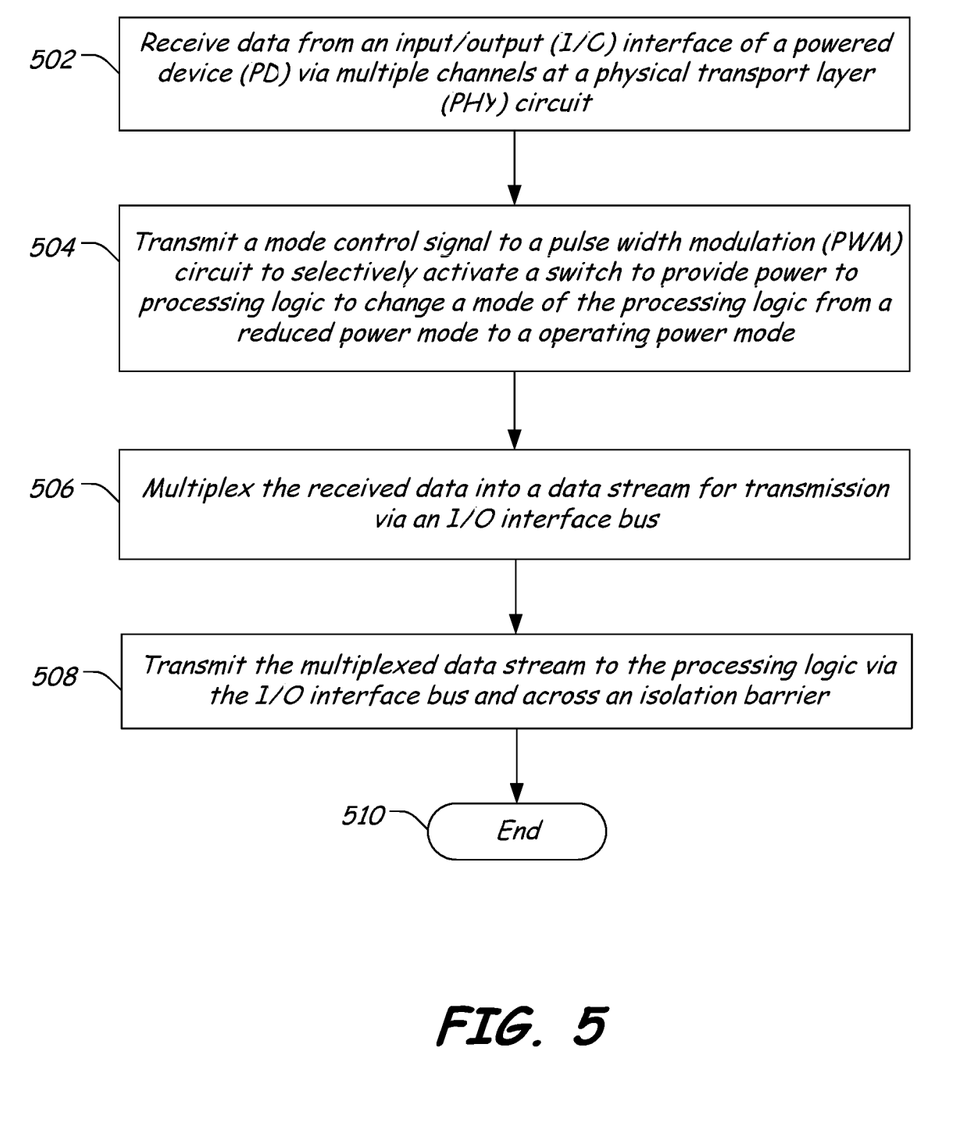
FIG. 5 is a flow diagram of a particular illustrative embodiment of a method of triggering a change in operating modes associated with the powered device.

FIG. 5 is a flow diagram of a particular illustrative embodiment of a method of waking circuitry associated with the powered device. At 502, data is received from an input/output (I/O) interface of a powered device (PD) via multiple channels at physical transport layer (PHY) circuit. Advancing to 504, a mode control signal is transmitted to a pulse width modulation (PWM) circuit to selectively activate a switch to provide power to processing logic to change a mode of the processing logic from a reduced power mode to an operating power mode. Continuing to 506, the received data is multiplexed into a data stream for transmission via an input/output (I/O) interface bus. In a particular embodiment, the I/O interface bus can be a media independent interface (MII), a Gigabit MII (GMII), a Reduced GMII (RGMII), or another high speed interface. Proceeding to 508, the data stream is transmitted to the processing logic via the I/O interface bus and across an isolation barrier. In a particular embodiment, the isolation barrier is an analog or a digital isolation barrier that is shared by the multiple channels of the PHY circuit to maintain electrical isolation between the processing logic and the PHY circuit. The method terminates at 510.

In conjunction with the systems and methods described with respect to FIGS. 1-5, a physical transport layer (PHY) circuit of a circuit device can be isolated from media access control (MAC) circuitry, system on a chip (SOC) circuitry, microprocessor circuitry, processing logic, other circuits, or any combination thereof via an isolation barrier circuit. Further, the PHY circuit can be coupled to an I/O interface to receive data from multiple channels. The PHY circuit can communicate the data from the multiple channels across a bi-directional input/output (I/O) interface bus (such as a media independent interface (MII), a Gigabit MII (GMII), a Reduced GMII (RGMII), or another high speed data bus) by multiplexing the data into a data stream that can be sent across the isolation barrier to the electrically isolated circuitry.

In a particular embodiment, the isolation barrier can be a digital isolation barrier, such as a capacitor, a pulse transformer, a radio frequency (RF) isolation circuit, an optical isolation circuit, another digital isolation circuit, or any combination thereof to provide electrical isolation for the isolated circuitry in a digital implementation. In another particular embodiment, the isolation barrier can be an analog isolation barrier, such as a transformer, for analog implementations. In a particular embodiment, the isolation barrier can be a high-speed isolation circuit that is shared by the multiple channels of the PHY circuit (using a multiplexer, a serializer/deserializer (SERDES) circuit, or any combination thereof) to allow bi-directional electrically isolated data communications between the multi-channel PHY circuit and the isolated circuitry.

In another particular embodiment, the PHY circuit and the PD circuit can be combined in a single integrated circuit package. Further, the PHY circuit and the PD circuit are adapted to receive power from a network I/O interface before power is provided to the isolated circuitry. In a particular example, the PHY circuit is adapted to negotiation a communications link between the circuit and a network device, and the PD circuit is adapted to perform powered device detection and/or powered device power classification operations to negotiate a power supply from the network device, prior to delivering power to the isolated circuitry. Since the entire circuit need not be powered prior to link negotiation and powered device detection/classification operations, the communications link negotiation process can be performed more quickly than with link negotiation processes that are controlled by the isolated circuitry. Further, overall power consumption is reduced since portions of the circuit can be powered down during periods of inactivity and can be reactivated by the PHY circuit in response to receiving data, receiving a wakeup command, or any combination thereof.

Although the present invention has been described with reference to preferred embodiments, workers skilled in the art will recognize that changes may be made in form and detail without departing from the spirit and scope of the invention.

What is claimed is:

1. A powered device comprising:
   an input/output (I/O) interface adapted to couple to a network cable to receive power and data;
   a physical transport layer (PHY) circuit including multiple channels coupled to the I/O interface, the PHY circuit adapted to send data to and receive data from a network device via the multiple channels;
   a processing logic circuit;
   a multiplexer circuit coupled to the PHY circuit to multiplex data from the multiple channels into a multiplexed data stream for transmission to the processing logic circuit; and an isolation barrier circuit coupled between the multiplexer circuit and the processing logic circuit, the isolation barrier adapted to electrically isolate the processing logic circuit from the multiplexer circuit, the PHY circuit, and the I/O interface.

2. The powered device of claim 1, further comprising a powered device (PD) control circuit coupled to the multiplexer circuit to receive control signals from the processing logic circuit or from the PHY circuit.

3. The powered device of claim 2, wherein the PD control circuit and the PHY circuit receive power from the I/O interface.

4. The powered device of claim 2, wherein the PD control circuit comprises:
   powered device (PD) detection logic to provide a device signature to the network device during a PD detection process;
   PD classification logic to provide a power classification signature to the network device during a PD classification process; and
   logic to control a regulated power supply to provide operating power to the processing logic circuit during operation.

5. The powered device of claim 1, wherein the PHY circuit is adapted to negotiate a data link to the network device independent from the processing logic circuit and other circuitry.

6. The powered device of claim 5, wherein the PHY circuit is adapted to negotiate the data link using one of a vendor specific identifier and a vendor specific link negotiation protocol.

7. The powered device of claim 1, wherein the particular circuit includes a power saving mode to disable selected circuitry during periods of inactivity.

8. The powered device of claim 7, wherein the PHY circuit is adapted to receive data from the I/O interface and to trigger the processing logic circuit to enter an operating mode in response to receiving the data.

9. A circuit device for use within a powered device, the circuit device comprising:
   a physical transport layer (PHY) circuit including multiple channels coupled to an I/O interface, the PHY circuit adapted to send data to and receive data from a network device via the multiple channels;
   a multiplexer circuit coupled to the PHY circuit to multiplex data from the multiple channels onto a bidirectional input/output (I/O) interface bus; and
   a digital isolation barrier circuit coupled to the bidirectional I/O interface bus and adapted to electrically isolate processing logic from the multiplexer circuit, the PHY circuit, and the I/O interface.

10. The circuit device of claim 9, wherein the bidirectional I/O interface bus comprises one of a media independent interface (MII) bus, a Gigabit MII (GMII) bus, and a Reduced GMII (RMII) bus.

11. The circuit device of claim 9, further comprising a powered device (PD) control circuit coupled to the PHY circuit and adapted to manage power over Ethernet (PoE) PD detection and classification processes.

12. The circuit device of claim 11, further comprising a power regulation circuit to receive power from the I/O interface and to produce a regulated power supply for the processing logic; wherein the PD control circuit is adapted to control the power regulation circuit.

13. The circuit device of claim 9, wherein the PHY circuit is adapted to negotiate a communications link to the network device independent from the processing logic.

14. The circuit device of claim 9, wherein the processing logic includes a reduced power mode to deactivate selected circuits during periods of inactivity.

15. The circuit device of claim 14, wherein the PHY circuit is adapted to receive a data signal during a period of inactivity and to trigger the processing logic to switch from the reduced power mode to an operating mode in response to receiving the data signal.

16. The circuit device of claim 9, wherein the isolation barrier comprises a digital isolation barrier.

17. The circuit device of claim 16, wherein the digital isolation barrier comprises a chip-scale isolation barrier.

18. A method of providing electrical isolation, the method comprising:
   receiving data via multiple channels from an input/output (I/O) interface at a physical transport layer (PHY) circuit of a powered device;
   multiplexing the data from the multiple channels into a multiplexed data stream for transmission via a media independent interface (MII) bus using a multiplexer coupled to the PHY circuit; and
   electrically isolating the PHY circuit from media access control (MAC) circuitry coupled to the MII bus using a digital isolation barrier coupled between the multiplexer and the MAC circuitry.

19. The method of claim 18, further comprising:
   detecting data at the PHY circuit of the powered device; and
   triggering the media access control circuitry to switch from a reduced power mode to an operating mode in response to detecting the data.

20. The method of claim 18, further comprising negotiating a communications link between the I/O interface of the powered device and a network device coupled to the MII interface using the PHY circuit.

21. The method of claim 18, further comprising:
   receiving a powered device (PD) detection signal at the I/O interface during a PD detection operation; and
   generating a PD signature using a PD control circuit in response to receiving the PD detection signal;
   wherein the PD control circuit and the PHY circuit comprise a single integrated circuit package.

22. The method of claim 18, wherein the MII bus comprises a Gigabit media independent interface (GMII) bus.

23. The method of claim 18, wherein the MII bus comprises a Reduced Gigabit media independent interface (RGMII) bus.

* * * * *